US010505102B2

(12) United States Patent
Strutz et al.

(10) Patent No.: US 10,505,102 B2
(45) Date of Patent: Dec. 10, 2019

(54) SEMICONDUCTOR DEVICE FOR SENSING A MAGNETIC FIELD INCLUDING AN ENCAPSULATION MATERIAL DEFINING A THROUGH-HOLE

(71) Applicant: Infineon Technologies AG, Neubiberg (DE)

(72) Inventors: Volker Strutz, Tegernheim (DE); Klaus Elian, Alteglofsheim (DE); Cyrus Ghahremani, Regensburg (DE); Rainer Markus Schaller, Saal a. d. Donau (DE)

(73) Assignee: Infineon Technologies AG, Neubiberg (DE)

( * ) Notice: Subject to any disclaimer, the term of this patent is extended or adjusted under 35 U.S.C. 154(b) by 5 days.

(21) Appl. No.: 15/089,984

(22) Filed: Apr. 4, 2016

(65) Prior Publication Data

US 2017/0288130 A1    Oct. 5, 2017

(51) Int. Cl.
| H01L 43/02 | (2006.01) |
| G01R 33/07 | (2006.01) |
| H01L 43/06 | (2006.01) |
| H01L 43/08 | (2006.01) |
| H01L 43/12 | (2006.01) |

(52) U.S. Cl.
CPC .............. *H01L 43/02* (2013.01); *G01R 33/07* (2013.01); *H01L 43/065* (2013.01); *H01L 43/08* (2013.01); *H01L 43/12* (2013.01); *H01L 2224/48091* (2013.01); *H01L 2224/48247* (2013.01); *H01L 2924/181* (2013.01)

(58) Field of Classification Search
CPC . H01L 2224/73265; H01L 2224/48227; H01L 2924/181; H01L 43/00; H01L 43/02; H01L 43/04; H01L 43/06; H01L 43/065; H01L 43/14; H01L 43/08; H01L 43/12; H01L 2224/47; H01L 2224/48; H01L 2224/4801; H01L 2224/4805; H01L 2224/48091; H01L 2224/4813; G01R 33/07; G01R 33/066; G01R 33/06; G01R 33/072; G01R 33/075; G01R 33/077
See application file for complete search history.

(56) References Cited

U.S. PATENT DOCUMENTS

| 5,891,377 A * | 4/1999 | Libres | B29C 45/14655 |
| | | | 257/E21.504 |
| 9,040,352 B2 * | 5/2015 | Kuo | H01L 23/49575 |
| | | | 257/414 |

(Continued)

FOREIGN PATENT DOCUMENTS

| DE | 10 2012 212 367 | 1/2013 |
| EP | 2 905 628 | 8/2015 |
| WO | 2012/047463 | 4/2012 |

*Primary Examiner* — Erik Kielin
(74) *Attorney, Agent, or Firm* — Dicke, Billig & Czaja, PLLC (57) ABSTRACT

A semiconductor device includes a substrate, a semiconductor die attached to the substrate, and an encapsulation material. The semiconductor die includes a sensing element. The encapsulation material encapsulates the semiconductor die and a portion of the substrate. The encapsulation material defines a through-hole to receive a conductive element. The sensing element may include a magnetic field sensor to sense a magnetic field generated by the conductive element.

16 Claims, 7 Drawing Sheets

(56) References Cited

U.S. PATENT DOCUMENTS

| | | | |
|---|---|---|---|
| 2003/0006752 A1* | 1/2003 | Goto | G01R 15/202 324/117 H |
| 2004/0080308 A1 | 4/2004 | Goto | |
| 2009/0039880 A1 | 2/2009 | Nomura et al. | |
| 2009/0127638 A1* | 5/2009 | Kilger | B81B 7/007 257/415 |
| 2010/0001715 A1 | 1/2010 | Doogue et al. | |
| 2010/0237853 A1 | 9/2010 | Bose et al. | |
| 2011/0127998 A1* | 6/2011 | Elian | B82Y 25/00 324/219 |
| 2012/0187943 A1* | 7/2012 | Ausserlechner | G01R 15/202 324/244 |
| 2013/0043865 A1* | 2/2013 | Makuth | G01R 33/07 324/251 |
| 2013/0200502 A1* | 8/2013 | Nikitin | H01L 24/82 257/666 |
| 2013/0330878 A1* | 12/2013 | Ararao | H01L 21/56 438/107 |
| 2014/0077797 A1 | 3/2014 | Nagao | |
| 2014/0321086 A1* | 10/2014 | Adachi | H05K 1/188 361/762 |
| 2015/0285841 A1 | 10/2015 | Doljack et al. | |
| 2016/0276304 A1* | 9/2016 | Raben | H01L 24/73 |

\* cited by examiner

SEMICONDUCTOR DEVICE FOR SENSING A MAGNETIC FIELD INCLUDING AN ENCAPSULATION MATERIAL DEFINING A THROUGH-HOLE

BACKGROUND

Current sensors based on sensing a magnetic field are affected by a technical conflict. On one hand, the magnetic field sensor should be placed as close as possible to the power path to be measured. On the other hand, there should be sufficient galvanic isolation between the power path, which may be at a high voltage, and the sensor inputs and outputs, which may be at a low voltage, to prevent electrical shock. To prevent harm to users due to electrical shock, current sensors should have reliable galvanic isolation over the product lifetime under all relevant environmental and user conditions.

For these and other reasons, there is a need for the present invention.

SUMMARY

One example of a semiconductor device includes a substrate, a semiconductor die attached to the substrate, and an encapsulation material. The semiconductor die includes a sensing element. The encapsulation material encapsulates the semiconductor die and a portion of the substrate. The encapsulation material defines a through-hole to receive a conductive element.

DETAILED DESCRIPTION

In the following Detailed Description, reference is made to the accompanying drawings, which form a part hereof, and in which is shown by way of illustration specific examples in which the disclosure may be practiced. In this regard, directional terminology, such as "top," "bottom," "front," "back," "leading," "trailing," etc., is used with reference to the orientation of the Figure(s) being described. Because components of examples can be positioned in a number of different orientations, the directional terminology is used for purposes of illustration and is in no way limiting. It is to be understood that other examples may be utilized and structural or logical changes may be made without departing from the scope of the present disclosure. The following detailed description, therefore, is not to be taken in a limiting sense, and the scope of the present disclosure is defined by the appended claims.

It is to be understood that the features of the various examples described herein may be combined with each other, unless specifically noted otherwise.

As used herein, the term "electrically coupled" is not meant to mean that the elements must be directly coupled together and intervening elements may be provided between the "electrically coupled" elements.

Current sensors for high current applications (e.g., 20-150 Amps), such as solar power systems and electrical drives, need sufficient galvanic isolation between the low voltage sensor component and the high voltage power path being sensed. As the size of current sensors shrink, the distance between the high voltage power path to be sensed and the low voltage sensor component shortens. Thus, sufficient galvanic isolation becomes more difficult to achieve, especially when transient or pulse voltage robustness requirements exceed the internal clearance distances within the current sensor.

Accordingly, examples of the semiconductor devices described herein include an inexpensive package construction fabricated using a single mold process where the encapsulation material of the semiconductor device provides the galvanic isolation. At least one through-hole is defined by the encapsulation material through which a conductive element for the high voltage power path to be sensed may be inserted. The through-hole position is reproducible at a well-defined distance from the low voltage sensor component within the package, thereby simplifying installation by eliminating any special precise handling mechanisms to set the spacing between the high voltage power path and the low voltage sensor component.

Figure 1A:
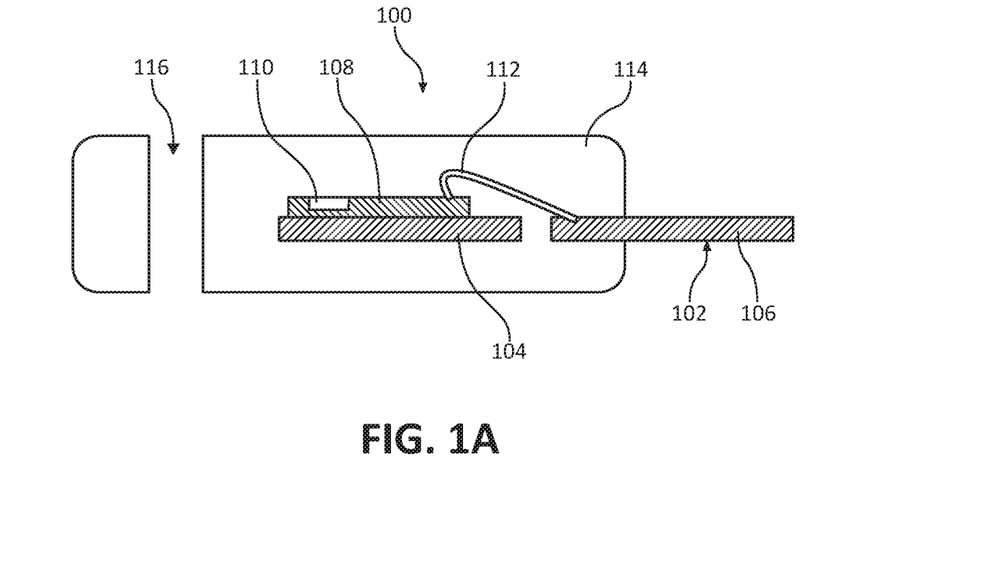
FIG. 1A illustrates a cross-sectional view and FIG. 1B illustrates a top view of one example of a semiconductor device including encapsulation material defining a through-hole.
Figure 1B:
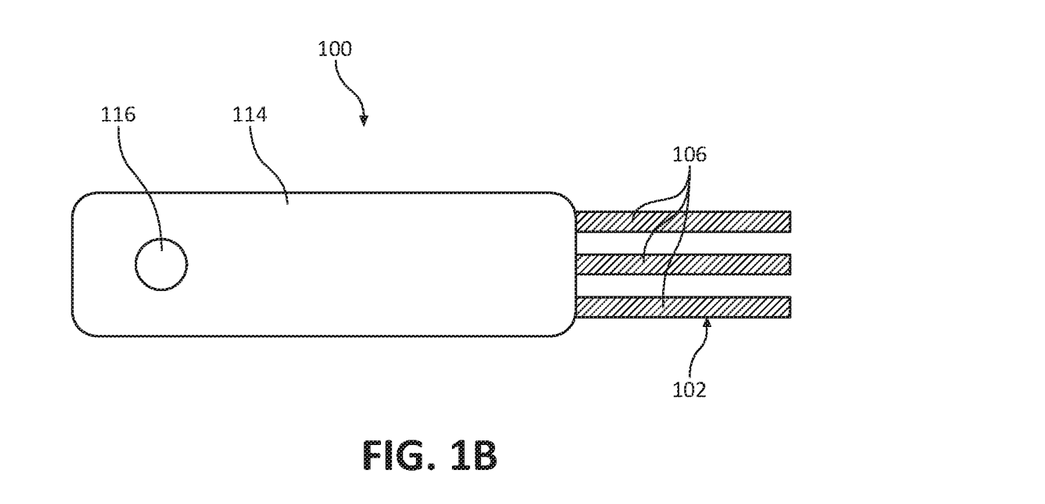

FIG. 1A illustrates a cross-sectional view and FIG. 1B illustrates a top view of one example of a semiconductor device 100 including encapsulation material defining a through-hole. Semiconductor device 100 includes a leadframe 102, a semiconductor die 108, and an encapsulation material 114. Leadframe 102 includes a die pad 104 and a plurality of leads 106. In other examples, a substrate, such as a laminate substrate, may be used in place of leadframe 102. Semiconductor die 108 is attached to the upper surface of die pad 104 via an adhesive material or another suitable material. Semiconductor die 108 includes a sensing element 110, such as a magnetic field sensor. In one example, the magnetic field sensor includes at least one magnetoresistive element (e.g., giant magnetoresistive element, tunneling magnetoresistive element) or at least one hall sensor. Contacts on the upper surface of semiconductor die 108 are electrically coupled to corresponding leads 106 via bond wires 112. In other examples, contacts of semiconductor die 108 may be electrically coupled to leads 106 via other suitable interconnects, such as ribbons and/or clips. In other examples, sensing element 110 and contacts of semiconductor die 108 may face leadframe 102 or a substrate used in place of leadframe 102. In this case, conductive bumps and/or conductive deposited traces may be used to electrically couple the contacts of semiconductor die 108 to leadframe 102 or to a substrate used in place of leadframe 102.

Encapsulation material 114 encapsulates bond wires 112, semiconductor die 108, and a portion of leadframe 102. Encapsulation material 114 includes an electrically insulating material, such as a mold material. Encapsulation material 114 defines a through-hole 116 for receiving a conductive element. Through-hole 116 is arranged at a predefined distance from sensing element 110 of semiconductor die 108. In one example, through-hole 116 is centered with semiconductor die 108.

Figure 2A:
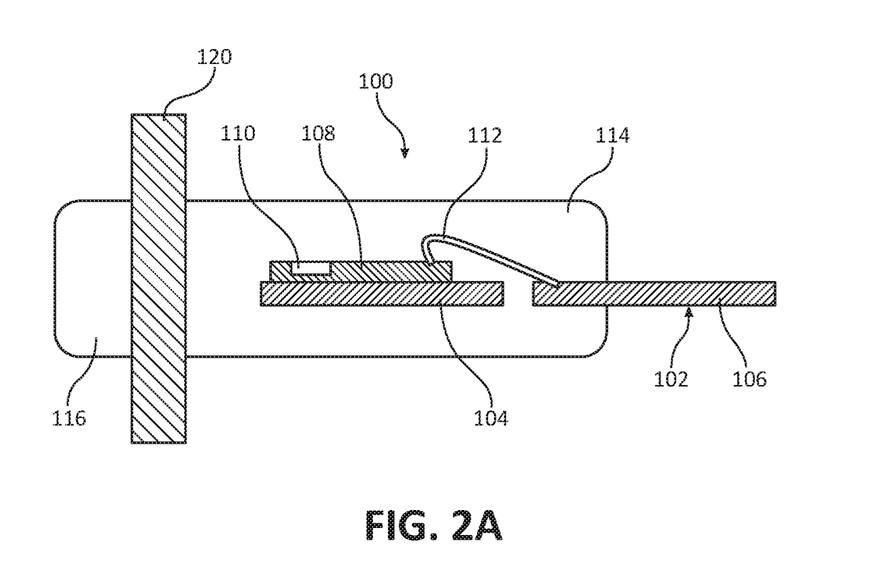
FIG. 2A illustrates a cross-sectional view and FIG. 2B illustrates a top view of one example of the semiconductor device of FIGS. 1A and 1B including a conductive element passing through the through-hole.
Figure 2B:
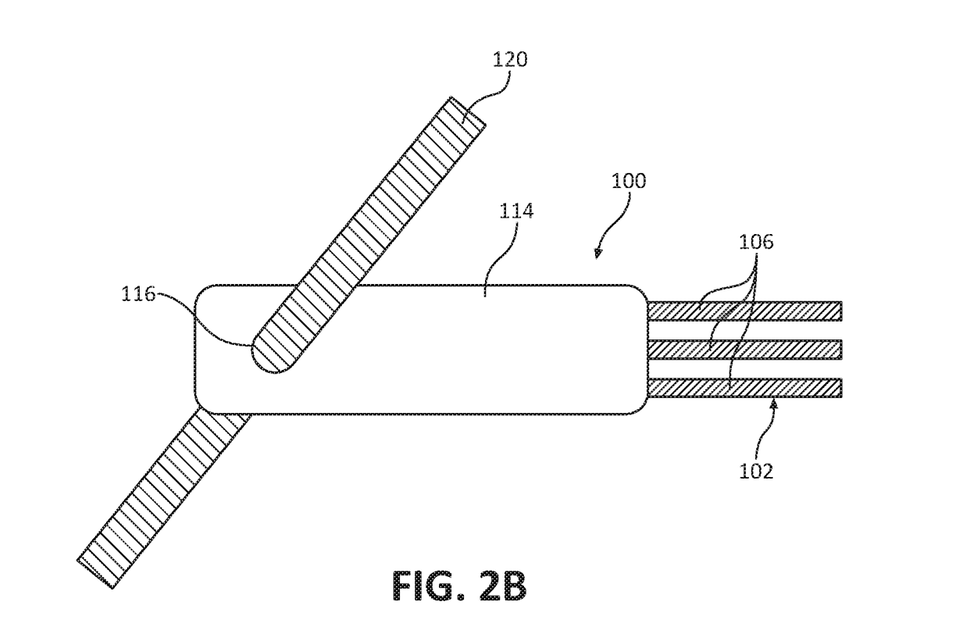

FIG. 2A illustrates a cross-sectional view and FIG. 2B illustrates a top view of one example of semiconductor device 100, as previously described and illustrated with reference to FIGS. 1A and 1B, including a conductive element 120 passing through through-hole 116. Conductive element 120 may be a wire, a power cord, a bus bar, or other suitable conductor for carrying a current to be measured by semiconductor device 100. Sensing element 110 senses a magnetic field generated by a current passing through conductive element 120. Based on the sensed magnetic field, the current passing through conductive element 120 may be measured by semiconductor die 108. Encapsulation material 114 provides galvanic isolation between conductive element 120 and semiconductor die 108.

Figure 3A:
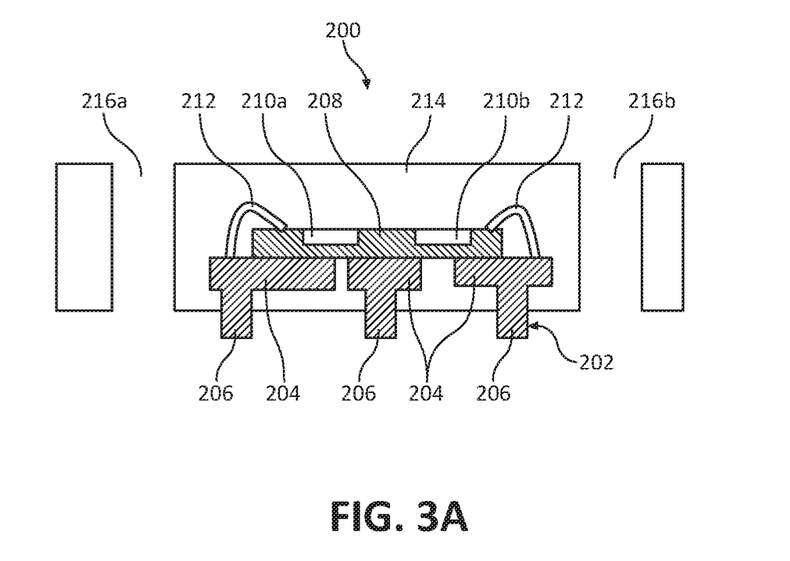
FIG. 3A illustrates a cross-sectional view and FIG. 3B illustrates a top view of one example of a semiconductor device including encapsulation material defining two through-holes.
Figure 3B:
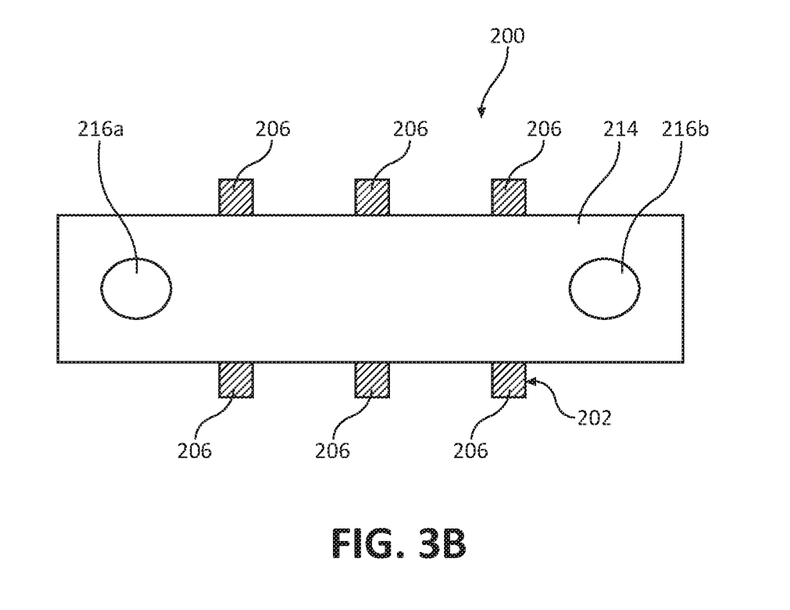

FIG. 3A illustrates a cross-sectional view and FIG. 3B illustrates a top view of one example of a semiconductor device 200 including encapsulation material defining two through-holes. In this example, semiconductor device 200 may be a surface-mount device (SMD). Semiconductor device 200 includes a leadframe 202, a semiconductor die 208, and an encapsulation material 214. Leadframe 202 includes a die pad 204 and a plurality of leads 206. Semiconductor die 208 is attached to the upper surface of die pad 204 via an adhesive material or another suitable material. Semiconductor die 208 includes a first sensing element 210a and a second sensing element 210b, such as magnetic field sensors. In one example, each magnetic field sensor includes at least one magnetoresistive element (e.g., giant magnetoresistive element, tunneling magnetoresistive element) or at least one hall sensor. Contacts on the upper surface of semiconductor die 208 are electrically coupled to corresponding leads 206 via bond wires 212. In other examples, contacts of semiconductor die 208 may be electrically coupled to leads 206 via other suitable interconnects, such as ribbons and/or clips.

Encapsulation material 214 encapsulates bond wires 212, semiconductor die 208, and a portion of leadframe 202. Encapsulation material 214 includes an electrically insulating material, such as a mold material. Encapsulation material 214 defines a first through-hole 216a and a second through-hole 216b for receiving a conductive element. First through-hole 216a may be arranged on a first side of semiconductor die 208, and second through-hole 216b may be arranged on a second side of semiconductor die 208 opposite to the first side. In one example, first through-hole 216a is arranged at a predefined distance from sensing element 210a of semiconductor die 208, and second through-hole 216b is arranged at a predefined distance from sensing element 210b of semiconductor die 208. In one example, first through-hole 216a and second through-hole 216b are centered with semiconductor die 208.

Figure 4A:
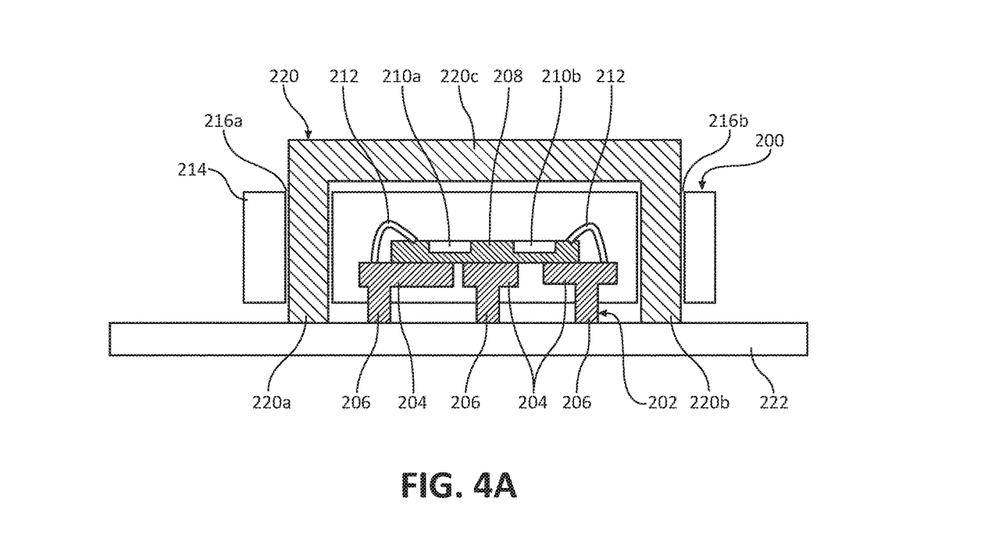
FIG. 4A illustrates a cross-sectional view and FIG. 4B illustrates a top view of one example of the semiconductor device of FIGS. 3A and 3B including a conductive element passing through the through-holes.
Figure 4B:
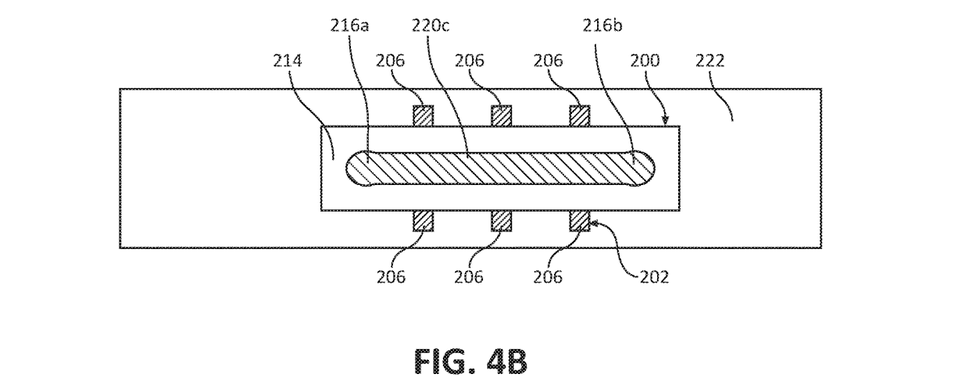

FIG. 4A illustrates a cross-sectional view and FIG. 4B illustrates a top view of one example of semiconductor device 200, as previously described and illustrated with reference to FIGS. 3A and 3B, electrically coupled to a printed circuit board (PCB) 222 and including a conductive element 220 passing through first through-hole 216a and second through-hole 216b. Conductive element 220 may be a wire, a power bridge, or other suitable conductor for carrying a current to be measured by semiconductor device 200. In one example, conductive element 220 is U-shaped and includes a first portion 220a extending through first through-hole 216a, a second portion 220b extending through second through-hole 216b, and a third portion 220c extending between the first portion 220a and the second portion 220b. Sensing elements 210a and 210b sense a magnetic field generated by a current passing through conductive element 220. Based on the sensed magnetic field, the current passing through conductive element 220 may be measured by semiconductor die 208. Encapsulation material 214 provides galvanic isolation between conductive element 220 and semiconductor die 208.

Figure 5A:
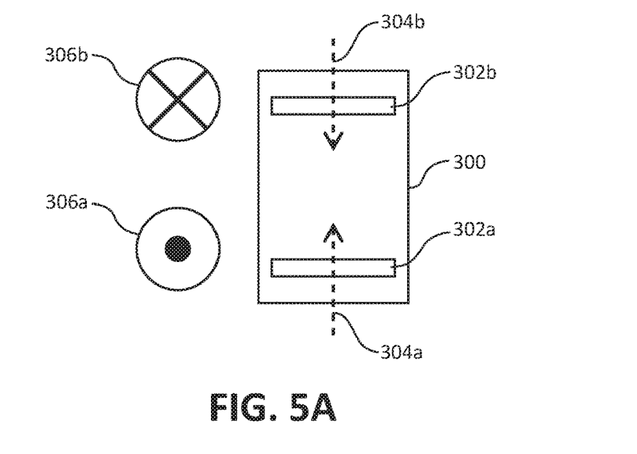
FIGS. 5A-5C illustrate top views of example differential measurement configurations for a semiconductor device.

FIG. 5A illustrates a top view of one example of a differential measurement configuration for a semiconductor device, such as semiconductor device 200 previously described and illustrated with reference to FIGS. 3A and 3B. In this example, a semiconductor die 300 of the semiconductor device includes a first magnetoresistive element 302a and a second magnetoresistive element 302b. A conductive element carrying a current to be measured includes a first portion 306a indicating a current coming out of the page and a second portion 306b indicating a current going into the page. A third portion of the conductive element connecting the first portion to the third portion is not shown. First magnetoresistive element 302a has in-plane sensitivity to sense a first magnetic field component as indicated at 304a, which is generated by the current passing through first portion 306a of the conductive element. Second magnetoresistive element 302b has in-plane sensitivity to sense a second magnetic field component as indicated at 304b, which is generated by the current passing through second portion 306b of the conductive element. Based on the sensed first magnetic field component 304a and the sensed second magnetic field component 304b, the current through the conductive element may be measured.

Figure 5B:
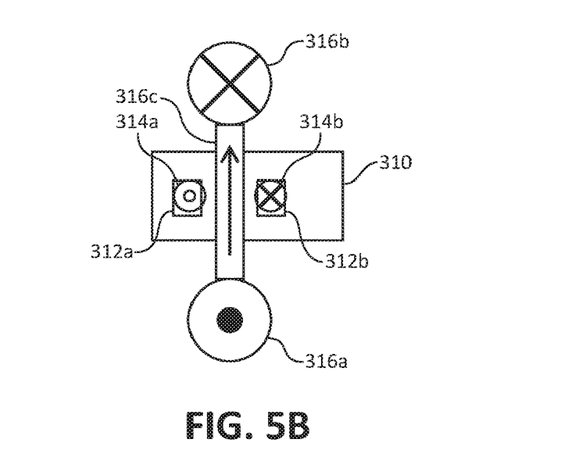

FIG. 5B illustrates a top view of another example of a differential measurement configuration for a semiconductor device, such as semiconductor device 200 previously described and illustrated with reference to FIGS. 3A and 3B. In this example, a semiconductor die 310 of the semiconductor device includes a first hall sensor 312a and a second hall sensor 312b. A conductive element carrying a current to be measured includes a first portion 316a indicating the current coming out of the page, a second portion 316b indicating the current going into the page, and a third portion 316c indicating the current passing from the first portion 316a to the second portion 316b. First hall sensor 312a has perpendicular sensitivity to sense a first magnetic field component coming out of the page as indicated at 314a, which is generated by the current passing through third portion 316c of the conductive element. Second hall sensor 312b has perpendicular sensitivity to sense a second magnetic field component as indicated at 314b going into the page, which is generated by the current passing through third portion 316c of the conductive element. Based on the sensed first magnetic field component 314a and the sensed second magnetic field component 314b, the current through the conductive element may be measured.

Figure 5C:
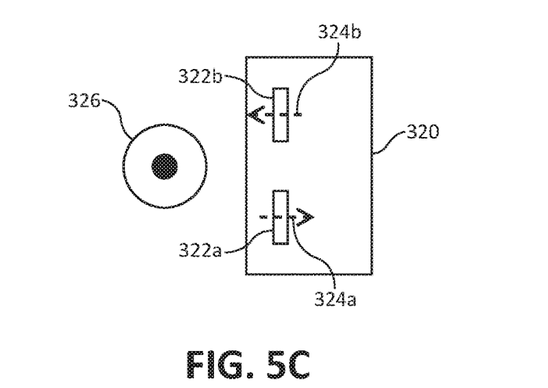

FIG. 5C illustrates a top view of another example of a differential measurement configuration for a semiconductor device, such as semiconductor device 100 previously described and illustrated with reference to FIGS. 1A and 1B or semiconductor device 200 previously described and illustrated with reference to FIGS. 3A and 3B. In this example, a semiconductor die 320 of the semiconductor device includes a first vertical hall sensor 322a and a second vertical hall sensor 322b. A conductive element carrying a current to be measured includes a portion 326 indicating a current coming out of the page. First vertical hall sensor 322a has quasi in-plane sensitivity to sense a first magnetic field component as indicated at 324a, which is generated by the current passing through portion 326 of the conductive element. Second vertical hall sensor 322b has quasi in-plane sensitivity to sense a second magnetic field component as indicated at 324b, which is generated by the current passing through portion 326 of the conductive element. Based on the sensed first magnetic field component 324a and the sensed second magnetic field component 324b, the current through the conductive element may be measured.

Figure 6:
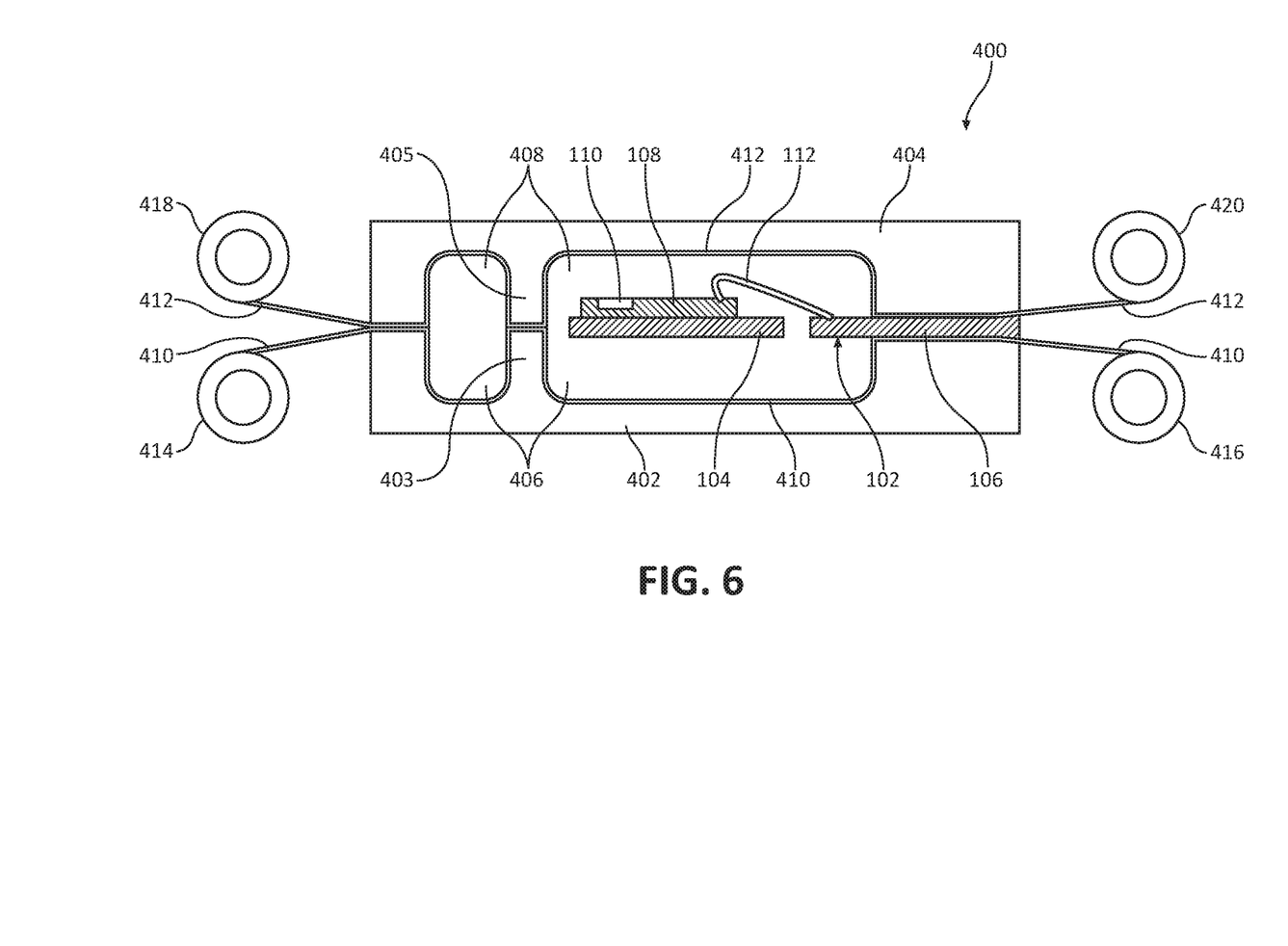
FIG. 6 illustrates a cross-sectional view of one example of a film assisted molding machine that may be used to fabricate a semiconductor device.

FIG. 6 illustrates a cross-sectional view of one example of a film assisted molding machine 400 that may be used to fabricate semiconductor device 100 previously described and illustrated with reference to FIGS. 1A and 1B. Film assisted molding machine 400 includes a lower mold 402, an upper mold 404, a lower fresh film reel 414, a lower used film reel 416, an upper fresh film reel 418, and an upper used film reel 420. Lower mold 402 defines a lower cavity 406 and includes a portion 403 extending through the cavity 406. Upper mold 404 defines an upper cavity 408 and includes a portion 405 extending through the cavity 408. Portion 403 of lower mold 402 and portion 405 of upper mold 404 define through-hole 116 (FIGS. 1A and 1B) when encapsulation material is injected into cavities 406 and 408.

In operation, lower mold 402 and upper mold 404 are opened (i.e., separated from each other) and fresh lower film as indicated at 410 and fresh upper film as indicated at 412 is unreeled from lower fresh film reel 414 and upper fresh film reel 418 between lower mold 402 and upper mold 404, respectively. The lower film 410 and the upper film 412 are then pressed (e.g., via air pressure) and/or pulled (e.g., via a vacuum) onto the inner surfaces of lower mold 402 and upper mold 404, respectively. An unencapsulated semiconductor device including a leadframe 102, a semiconductor die 108, and bond wires 112 is then inserted between lower mold 402 and upper mold 404 and lower mold 402 and upper mold 404 are closed as shown in FIG. 6.

Encapsulation material is then injected into cavities 406 and 408 to encapsulate bond wires 112, semiconductor die 108, and portions of leadframe 102. Once the encapsulation material is cured, lower mold 402 and upper mold 404 are opened and the completed semiconductor device is removed. The used lower film and the used upper film is then reeled onto lower used film reel 416 and upper used film reel 420 while fresh lower film and fresh upper film is unreeled, respectively, and the process is repeated to encapsulate another semiconductor device. In other examples, a molding process that does not use film assistance may be used to fabricate semiconductor devices including encapsulation material defining a through-hole. Instead of a molding process, in other examples bond wires 112, semiconductor die 108, and portions of leadframe 102 may be encapsulated using a dispensing or printing process. In yet other examples, the through-holes may be formed after encapsulating the semiconductor devices, such as by drilling through the encapsulation material to form the through-holes.

Figure 7:
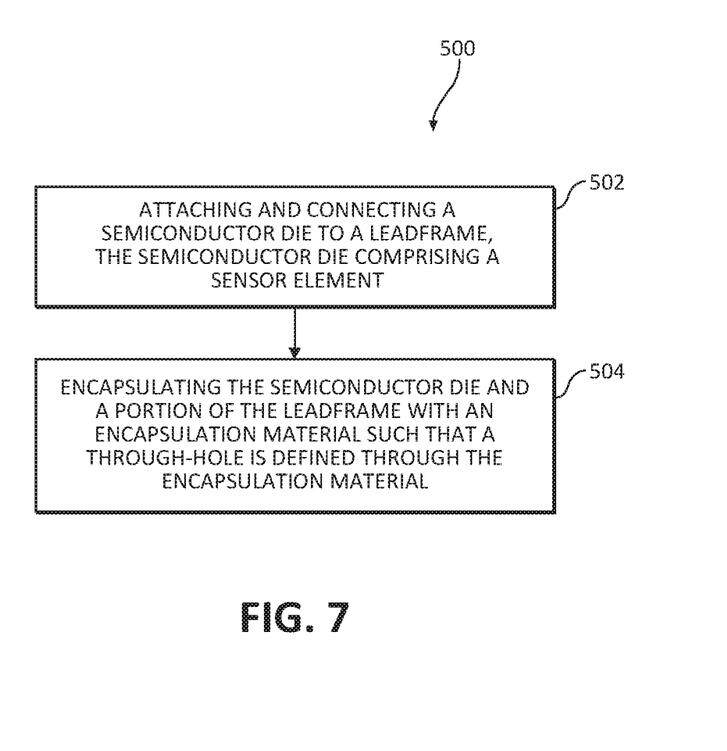
FIG. 7 is a flow diagram illustrating one example of a method for fabricating a semiconductor device including an encapsulation material defining a through-hole.

FIG. 7 is a flow diagram illustrating one example of a method 500 for fabricating a semiconductor device including an encapsulation material defining a through-hole. In one example, method 500 may be used to fabricate semiconductor device 100 previously described and illustrated with reference to FIGS. 1A and 1B or semiconductor device 200 previously described and illustrated with reference to FIGS. 3A and 3B. At 502, method 500 includes attaching and connecting a semiconductor die to a leadframe, the semiconductor die comprising a sensor element. At 504, method 500 includes encapsulating the semiconductor die and a portion of the leadframe with an encapsulation material such that a through-hole is defined through the encapsulation material.

In one example, the encapsulating includes encapsulating the semiconductor die and the portion of the leadframe using a film assisted molding process. In another example, the encapsulating includes encapsulating the semiconductor die and the portion of the leadframe such that two through-holes are defined through the encapsulation material. The semiconductor die and the portion of the leadframe may be encapsulated with a mold material. The sensor element may include a magnetic field sensor. In one example, method 500 further includes inserting a conductive element through the through-hole.

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and the equivalents thereof.

The invention claimed is:

1. A semiconductor device comprising:
    a die pad;
    a plurality of leads adjacent to the die pad;
    a semiconductor die attached to the die pad, the semiconductor die comprising a sensing element and electrically coupled to the plurality of leads; and
    an encapsulation material encapsulating the semiconductor die and a portion of the plurality of leads, the encapsulation material defining a through-hole to receive a conductive element separate from the semiconductor device, the through-hole arranged to be perpendicular to an upper surface of the semiconductor die and at a predefined distance from the semiconductor die, the semiconductor die arranged in the encapsulation material between the through-hole and the plurality of leads, the encapsulation material to galvanically isolate the conductive element from the semiconductor die,
    wherein the sensing element comprises a magnetic field sensor having an in-plane sensitivity to sense a magnetic field generated by a current passing through the conductive element.

2. The semiconductor device of claim 1, wherein the encapsulation material comprises an electrically insulating material.

3. The semiconductor device of claim 1, wherein the encapsulation material comprises a mold material.

4. The semiconductor device of claim 1, wherein the conductive element comprises a wire.

5. The semiconductor device of claim 1, further comprising:
    a conductor, wherein the conductor is the conductive element and passes through the through-hole.

6. A semiconductor device comprising:
    a die pad;
    a plurality of leads adjacent to the die pad;
    a semiconductor die attached to the die pad, the semiconductor die comprising a magnetic field sensor and electrically coupled to the plurality of leads; and an encapsulation material encapsulating the semiconductor die and a portion of the plurality of leads, the encapsulation material defining a first through-hole on a first side of the semiconductor die, the first through-hole arranged to be perpendicular to an upper surface of the semiconductor die, the encapsulation material defining a second through-hole on a second side of the semiconductor die opposite to the first side, the second through-hole arranged to be perpendicular to the upper surface of the semiconductor die, the semiconductor die and the portion of the plurality of leads arranged between the first through-hole and the second through-hole, the first through-hole to receive a first portion of a conductive element and the second through-hole to receive a second portion of the conductive element, wherein the conductive element is separate from the semiconductor device, wherein the encapsulation material galvanically isolates the conductive element from the semiconductor die, and wherein the magnetic field sensor has an in-plane sensitivity to sense a magnetic field generated by a current passing through the first portion and the second portion of the conductive element.

7. The semiconductor device of claim 6, wherein the conductive element comprises a U-shaped conductive element, wherein the first portion extends through the first through-hole, the second portion extends through the second through-hole, and a third portion extends between the first portion and the second portion.

8. The semiconductor device of claim 6, wherein the magnetic field sensor comprises a first magnetic field sensing element and a second magnetic field sensing element.

9. The semiconductor device of claim 6, wherein the encapsulation material comprises a mold material.

10. The semiconductor device of claim 6, wherein the magnetic field sensor comprises a magnetoresistive element or a hall sensor.

11. The semiconductor device of claim 6, wherein the semiconductor device comprises a surface-mount device.

12. The semiconductor device of claim 6, further comprising:
a conductor, wherein the conductor is the conductive element and passes through the first through-hole and the second through-hole.

13. A method for fabricating a semiconductor device, the method comprising:
attaching a semiconductor die to a die pad, the semiconductor die comprising a sensor element;
electrically coupling the semiconductor die to a plurality of leads; and
encapsulating the semiconductor die and a portion of the plurality of leads with an encapsulation material such that a through-hole is defined through the encapsulation material and arranged to be perpendicular to an upper surface of the semiconductor die and at a predefined distance from the semiconductor die, the semiconductor die arranged in the encapsulation material between the through-hole and the plurality of leads, the through-hole to receive and position a current carrying conductor separate from the semiconductor die at the predefined distance from the sensor element, the sensor element including a magnetic field sensor having an in-plane sensitivity to a magnetic field generated by a current passing through the current carrying conductor, the encapsulation material to galvanically isolate the current carrying conductor from the semiconductor die.

14. The method of claim 13, wherein the encapsulating comprises encapsulating the semiconductor die and the portion of the plurality of leads using a film assisted molding process.

15. The method of claim 13, wherein the encapsulating comprises encapsulating the semiconductor die and the portion of the plurality of leads such that two through-holes are defined through the encapsulation material.

16. The method of claim 13, wherein the encapsulating comprises encapsulating the semiconductor die and the portion of the plurality of leads with a mold material.

\* \* \* \* \*